United States Patent [19]

Eickman et al.

[11] Patent Number: 4,719,250

[45] Date of Patent: Jan. 12, 1988

[54] ENCAPSULATION OF ELECTRONIC COMPONENTS

[75] Inventors: Nancy C. Eickman, Mountainside; Charles E. McChesney, Monmouth Junction; Gary E. Williams, Short Hills; Hyun-Nam Yoon, Summit, all of N.J.

[73] Assignee: Hoechst Celanese Corporation, Bridgewater, N.J.

[21] Appl. No.: 872,009

[22] Filed: Jun. 9, 1986

Related U.S. Application Data

[60] Division of Ser. No. 619,608, Jun. 18, 1984, Pat. No. 4,632,798, which is a continuation-in-part of Ser. No. 517,870, Jul. 27, 1983, abandoned.

[51] Int. Cl.$^4$ ............................................. C08K 3/34
[52] U.S. Cl. ................................. 523/212; 523/216; 524/599; 524/605; 524/606
[58] Field of Search ............... 524/605, 493, 599, 606; 523/216, 212

[56] References Cited

U.S. PATENT DOCUMENTS

| | | | |
|---|---|---|---|
| 4,067,852 | 1/1978 | Calundann | 528/193 |
| 4,184,996 | 1/1980 | Calundann | 524/605 |
| 4,267,289 | 5/1981 | Froix | 525/444 |
| 4,267,304 | 5/1981 | Feasey et al. | 528/193 |
| 4,318,841 | 3/1982 | East et al. | 524/605 |
| 4,395,513 | 7/1983 | Calundann | 528/206 |
| 4,473,682 | 9/1984 | Calundann et al. | 528/128 |
| 4,539,386 | 9/1985 | Yoon | 528/183 |

OTHER PUBLICATIONS

Katz et al.; Handbook of Filler and Reinforcements for Plastics; Van Nostrand Reinhold Co.; 1978; pp. 137, 155-158.

Primary Examiner—Lewis T. Jacobs
Attorney, Agent, or Firm—Burns, Doane, Swecker & Mathis

[57] ABSTRACT

An improved thermoplastic molding composition is provided which is particularly suited for use in the impervious void-free encapsulation on a relatively expeditious basis of an electronic component wherein the preformed electronic component is positioned in a mold cavity prior to the introduction of the molding composition via injection molding. The molding composition comprises a melt processable thermotropic liquid crystalline polymer which is of a relatively low weight average molecular weight of approximately 4,000 to 25,000 (e.g. approximately 4,000 to 10,000) and which is substantially incapable of further chain growth upon heating. Uniformly dispersed within the liquid crystalline polymer is approximately 40 to 80 percent by weight (e.g. approximately 50 to 75 percent by weight) of a particulate inorganic material (preferably of silicon dioxide) which serves to advantageously decrease its volumetric coefficient of thermal expansion and to advantageously increase its thermal conductivity. In a preferred embodiment the electronic component which is encapsulated is a semiconductor device, such a relatively delicate quad or dual-in-line integrated circuit device which is assembled onto a flat prestamped lead frame or other conductive device having a plurality of leads which extend outside the area which is encapsulated. The resulting encapsulated electronic component is well protected in spite of the relatively low molecular weight of the liquid crystalline polymer and is capable of satisfactory service for an extended period of time even if adverse environmental conditions are encountered. A rugged commonly nonburning and relatively inexpensive package is provided.

21 Claims, No Drawings

ENCAPSULATION OF ELECTRONIC COMPONENTS

CROSS-REFERENCES TO RELATED APPLICATIONS

This application is a division of application Ser. No. 619,608, filed June 18, 1984 (now U.S. Pat. No. 4,632,798), which is a continuation-in-part of application Ser. No. 517,870, filed July 27, 1983 (now abandoned).

BACKGROUND OF THE INVENTION

Specific techniques for the encapsulation of electronic components within a protective synthetic resinous material are well known in the art and are widely practiced. See, for instance, the article entitled "Encapsulation of Semiconductor Devices" appearing in Plastics Design Forum Issue, April, 1981, at Pages 49 to 54.

Heretofore, thermosetting resinous materials commonly have been employed to bring about the desired encapsulation through a form of injection molding commonly termed transfer molding. For instance, epoxy resins (e.g. novolac-hardened epoxy systems) commonly have been employed for this purpose. Also, thermosetting resins such as unsaturated polyesters, bisimido polymers, etc., have been proposed for use as encapsulation materials. See, for instance U.S. Pat. Nos. 4,327,369; 4,374,080; and 4,390,596. Such thermosetting materials often require refrigeration prior to use, tend to require relatively long cycle times during molding, and after molding must be cured for extended periods of time at elevated temperatures in an oven before the desired cure of the encapsulant is complete. Since the viscosity of the uncured thermosetting resin increases with curing as the resin is heated, relatively prompt use of the uncured material must be made once heating is commenced, With such materials the recycle of scrap is impossible. Additionally, such materials having naturally occurring resin binders commonly have a tendency to flash and to adhere to the surfaces of the mold cavity causing possible mold damage thus requiring the substantial remedial attention of skilled personnel during the course of a molding run. This may preclude fully automating the encapsulation process.

While not utilized on a commercial scale, certain thermoplastic resins have heretofore been proposed for use in the encapsulation of electronic components. See, for instance, U.S. Pat. No. 4,327,369 at Col. 6, lines 18 to 23, where passing reference is found to polyvinyl chloride, polyolefins, such as low-density polyethylene, high density polyethylene, polypropylene, and polystyrene. See also, U.S. Pat. No. 4,370,292 where a polyphenylene sulfide composition which includes a phenoxy resin is proposed for encapsulation.

It is a common practice of the prior art to include within the encapsulating resin a particulate filler material such as silica or alumina which serves among other things to increase the thermal conductivity and to decrease the volumetric coefficient of thermal expansion of the molded composition. Such particulate fillers, however, greatly modify (i.e. increase) the viscosity of the composition during molding especially when present in high concentrations. If the viscosity becomes too great the molding composition becomes difficult to cause to flow and to satisfactorily fill the mold. If voids are present in the molded article the encapsulation will be considered a failure. If the viscous composition is caused to flow through increased pressure, this may damage the delicate electronic component undergoing encapsulation. This damage is termed "wire sweep" in U.S. Pat. No. 4,374,080. Such sweep or deflection may severly stress or break the electrical circuit as bonds are torn or cause deleterious shorting. Also if one attempts to achieve the requisite viscosity for the molding composition through the reduction of the molecular weight of a thermoplastic encapsulant, then the resulting molded article commonly will possess inadequate mechanical properties (e.g. brittleness). If the polymeric material possesses contamination inherent in many polymerization processes (e.g. water-extractable halogens or water-extractable ionic materials), such contamination may attack the encapsulated electronic component and/or adversely influence its operation. Also, if the polymeric material has a propensity substantially to evolve gaseous by-products for any reason (e.g. because of a condensation polymerization reaction) during the molding operation or during subsequent use of the encapsulated electronic component, this can lead to excessive voids and the failure of the encapsulant composition. In addition to the above shortcomings many thermoplastics are incapable of prolonged reliable service at the elevated temperatures commonly encountered by electronic components and/or readily burn when subjected to flame thereby diminishing their protective properties.

It is an object of the present invention to provide an improved molding composition which is particularly suited for use in the impervious encapsulation of an electronic component.

It is an object of the present invention to provide an improved thermoplastic molding composition which is particularly suited for the encapsulation of a delicate electronic component such as a quad or a dual-in-line integrated circuit.

It is an object of the present invention to provide an improved thermoplastic molding composition containing a substantial quantity of a particulate inorganic material which is capable of encapsulating a delicate electronic component without damage to yield a final encapsulated product which exhibits highly satisfactory mechanical, thermal, chemical, and electrical properties which render it capable of satisfactory service for an extended period of time even if adverse environmental conditions are encountered.

It is an object of the present invention to provide an improved method for encapsulating an electronic component which can be carried out without the need for a time consuming polymer curing step as commonly practiced in the prior art.

It is another object of the present invention to provide an improved encapsulated electronic component.

It is a further object of the present invention to provide an improved encapsulated electronic component wherein the filled encapsulating resin is substantially impervious to water and ultraviolet light, is substantially void-free, exhibits satisfactory mechanical properties (e.g. mechanical strength), exhibits a satisfactory volumetric coefficient of thermal expansion, exhibits a satisfactory thermal conductivity, contains less than 50 parts per million of water-extractable alkali metal, contains less than 100 parts per million of water-extractable halogen, exhibits a V-0 burning rating when subjected to the UL-94 test, and is capable of extended service.

These and other objects as well as the scope, nature, and utilization of the claimed invention will be apparent to those skilled in the art from the following detailed description and appended claims.

SUMMARY OF THE INVENTION

It has been found that a molding composition which is particularly suited for use in the impervious encapsulation of an electronic component via injection molding comprises (a) a melt processable polymer which is capable of forming an anisotropic melt phase, has a weight average molecular weight of approximately 4,000 to 25,000, and which is substantially incapable of further chain growth upon heating, and (b) approximately 40 to 80 percent by weight based upon the total weight of the molding composition of a particulate inorganic material substantially uniformly dispersed in component (a) which is capable of decreasing the volumetric coefficient of thermal expansion and increasing the thermal conductivity of component (a).

It has been found that an improved method for imperviously encapsulating an electronic component comprises:

(1) introducing the electronic component to be encapsulated within a mold cavity, (2) completely filling the mold cavity surrounding the electronic component by injection at an elevated temperature of a molding composition comprising (a) a molten melt processable polymer which is capable of forming an anisotropic melt phase, has a weight average molecular weight of approximately 4,000 to 25,000, and which is substantially incapable of further chain growth upon heating, and (b) approximately 40 to 80 percent by weight based upon the total weight of the molding composition of a particulate inorganic material substantially uniformly dispersed in component (a) which is capable of decreasing the volumetric coefficient of thermal expansion and increasing the thermal conductivity of component (a), (3) cooling the contents of the mold cavity to allow the molding composition to solidify and to form an impervious package around the electronic component, and (4) removing the resulting encapsulated electronic component from the mold cavity.

It has been found that an improved article of manufacture comprises an electronic component imperviously encapsulated within a composition of matter comprising (a) a melt processable polymer which is capable of forming an anisotropic melt phase, has a weight average molecular weight of approximately 4,000 to 25,000, and which is substantially incapable of further chain growth upon heating, and (b) approximately 40 to 80 percent by weight based upon the total weight of the composition of matter of a particulate inorganic material substantially uniformly dispersed in component (a) which is capable of decreasing the volumetric coefficient of thermal expansion and increasing the thermal conductivity of component (a).

DESCRIPTION OF PREFERRED EMBODIMENTS

A wide variety of electronic components may be effectively encapsulated within an impervious substantially void-free package in accordance with the concept of the present invention. Such components may be relatively simple electronic devices or relatively complex entities and may be regarded as elements for use in a larger electronic system. Representative components which may be encapsulated are transistors, capacitors, relays, diodes, resistors, networks of resistors, integrated circuits, etc. In preferred embodiments the electronic components are delicate semiconductor devices. These may be bipolar, field-effect devices, etc. The integrated circuits which may be encapsulated can be provided in a variety of configurations and the relatively small silicon or other semiconductor chips which commonly support the same may have as few as 2 or up to 100, or more, contacts to the outside world. As is well known in the art, typical integrated circuit packages commonly are fabricated on a thin metal frame of approximately 0.01 inch in thickness which is composed of copper or of copper which has been plated with another metal, such as a tin-alloy. A solder coated lead frame can be provided. In such instances a subsequent soldering dip of the projecting electrical contacts following encapsulation will not be necessary. The integrated circuit die or chip is cemented to the paddle portion of the lead frame, and the die or chip is electrically connected to the lead frame with thin wires commonly of gold having a diameter of approximately 0.001 inch or less. These wires are spot welded or otherwise attached from the contact or bonding pads on the integrated circuit die or chip commonly formed of extremely thin aluminum films to the ends of cantilever arms on the lead frame. Accordingly, in a particularly preferred embodiment the electronic device is a quad or a dual-in-line integrated circuit device which is assembled onto a flat prestamped lead frame having a plurality of leads which extend outside the area which is encapsulated. For instance, a 40 pin lead frame may be selected for encapsulation.

The first essential component of the molding composition in accordance with the concept of the present invention is a melt processable thermotropic liquid crystalline polymer which has a relatively low weight average molecular weight of approximately 4,000 to 25,000, and which is substantially incapable of further chain growth upon heating at its melt processing temperature.

As is known in polymer technology a thermotropic liquid crystalline polymer exhibits optical anisotropy in the melt. The anisotropic character of the polymer melt may be confirmed by conventional polarized light techniques whereby crossed-polarizers are utilized. More specifically, the anisotropic or ordered nature of the melt phase may conveniently be confirmed by the use of a Leitz polarizing microscope at a magnification of 40X with the sample on a Leitz hot stage and under a nitrogen atmosphere. The amount of light transmitted changes when the sample is forced to flow; however, the sample is optically anisotropic even in the static state. On the contrary typical melt processable polymers do not transmit light to any substantial degree when examined under quiescent conditions and are isotropic in nature.

Representative classes of polymers from which the thermotropic liquid crystalline polymer suitable for use in the present invention may be selected include wholly aromatic polyesters, aromatic-aliphatic polyesters, wholly aromatic poly(ester-amides), aromatic-aliphatic poly(ester-amides), aromatic polyazomethines, aromatic polyester-carbonates, and mixtures of the same. In preferred embodiments the thermotropic liquid crystalline polymer is a wholly aromatic polyester, or a wholly aromatic poly(ester-amide). A polymer is considered to be wholly aromatic when each moiety present within the polymer chain contributes at least one aromatic ring. Also, it is preferred that naphthalene moieties be included in the thermotropic liquid crystalline polymer, e.g. 6-oxy-2-naphthoyl moiety, 2,6-dioxynaphthalene moiety, or 2,6-dicarboxynaphthalene moiety, in a concentration of not less than about 10 mole percent. The particularly preferred naphthalene moiety for inclusion in the thermotropic liquid crystalline polymer is the 6-oxy-2-naphthoyl moiety in a concentration of not less than about 10 mole percent.

Representative wholly aromatic polyesters which exhibit thermotropic liquid crystalline properties include those disclosed in the following U.S. patents which are herein incorporated by reference: U.S. Pat. Nos. 3,991,013; 3,991,014; 4,066,620; 4,067,852; 4,075,262; 4,083,829; 4,093,595; 4,118,372; 4,130,545; 4,146,702; 4,153,779; 4,156,070; 4,159,365; 4,161,470; 4,169,933; 4,181,792; 4,183,895; 4,184,996; 4,188,476; 4,201,856; 4,219,461; 4,224,433; 4,226,970; 4,230,817; 4,232,143; 4,232,144; 4,238,598; 4,238,599; 4,238,600; 4,242,496; 4,245,082; 4,245,084; 4,247,514; 4,256,624; 4,265,802; 4,267,304; 4,269,965; 4,279,803; 4,294,955; 4,299,756; 4,318,841: 4,335,232; 4,337,190; 4,337,191; 4,347,349; 4,355,134; 4,359,569; 4,360,658; 4,370,466; 4,374,228; 4,374,261; 4,375,530; and 4,377,681.

Representative aromatic-aliphatic polyesters which exhibit thermotropic liquid crystalline properties are copolymers of polyethylene terephthalate and hydroxybenzoic acid as disclosed in *Polyester X-7G-A Self Reinforced Thermoplastic*, by W. J. Jackson, Jr. H. F. Kuhfuss, and T. F. Gray, Jr., 30th Anniversary Technical Conference, 1975 Reinforced Plastic Composites Institute, The Society of the Plastics Industry, Inc., Section 17-D, Pages 1–4. A further disclosure of such copolymers can be found in "Liquid Crystal Polymers: I. Preparation and Properties of p-Hydroxybenzoic Acid Copolymers, *Journal of Polymer Science, Polymer Chemistry Edition*, Vol. 14, pages 2043 to 2058 (1976), by W. J. Jackson, Jr. and H. F. Kuhfuss. See also commonly assigned U.S. Pat. Nos. 4,318,842, and 4,355,133. These disclosures are herein incorporated by reference.

Representative wholly aromatic and aromatic-aliphatic poly(ester-amides) which exhibit thermotropic liquid crystalline properties are disclosed in U.S. Pat. Nos. 4,272,625; 4,330,457; 4,339,375; 4,341,688; 4,351,917; 4,351,918 and 4,355,132, which are herein incorporated by reference.

Representative aromatic polyazomethines which exhibit a thermotropic liquid crystalline properties are disclosed in U.S. Pat. Nos. 4,048,148; and 4,122,070. Each of these patents is herein incorporated by reference. Specific examples of such polymers include poly(nitrilo-2-methyl-1,4-phenylenenitriloethylidyne-1,4-phenyleneethylidyne); poly(nitrilo-2-methyl-1,4-phenylenenitrilo-methylidyne-1,4-phenylene-methylidyne); and poly(nitrilo-2-chloro-1,4-phenylenenitrilomethylidyne-1,4-phenylene-methylidyne).

Representative aromatic polyester-carbonates which exhibit thermotropic liquid crystalline properties are disclosed in U.S. Pat. Nos. 4,107,143; 4,284,757; and 4,371,660 which are herein incorporated by reference.

The anisotropic melt-forming polymer optionally may be blended with one or more other melt processable polymers which may or may not be capable of forming an anisotropic melt phase provided the resulting blend is capable of forming the required anisotropic melt phase of the proper melt viscosity. Representative polymer blends which exhibit thermotropic liquid crystalline properties are disclosed in commonly assigned U.S. Pat. Nos. 4,267,289 and 4,276,397, and copending U.S. Ser. Nos. 158,547, filed June 11, 1980 (now U.S. Pat. No. 4,489,190); 165,536, filed July 3, 1980 (now U.S. Pat. No. 4,460,735); and 165,532, filed July 3, 1980 (now U.S. Pat. No. 4,460,736) which are herein incorporated by reference.

In a preferred embodiment the melt processable anisotropic melt-forming polymer exhibits a weight average molecular weight of approximately 4,000 to 10,000. The weight average molecular weight may be determined by use of standard gel permeation chromatography. For instance, in a typical test approximately 150 microliters of a 0.1 percent by weight polymer solution in a solvent consisting of a 1:1 mixture on a volume basis of pentafluorophenol and hexafluoroisopropanol are introduced into the gel permeation chromatography equipment consisting of a main control unit (e.g. a Waters liquid chromatograph Model No. 201), four columns containing porous silica particles (e.g. DuPont SE4000, DuPont SE1000, DuPont SE100, and Waters 60 Angstrom Microporasil), and a laser light scattering unit (e.g. Chromatix KMX6) at ambient temperature. Typical melt processable anisotropic melt-forming polymers commonly show a retention time distribution in the range of 20 to 50 minutes.

In order for the melt processable polymer which is selected for use to be substantially incapable of further chain growth upon heating at its melt processing temperature, it is essential that the polymer chains terminate in functional groups which are substantially incapable of a further polymerization reaction between the adjoining polymer chains. When such polymer is heated in an inert atmosphere (e.g. nitrogen or argon) for 30 minutes while at a temperature of 340° C., its weight average molecular weight preferably increases no more than 15 percent and most preferably no more than 10 percent. Accordingly, the polymer does not generate to any substantial degree void-forming gaseous by-products when heated and its melt viscosity does not increase to any substantial degree upon the passage of time while being heated. Those thermotropic liquid crystalline polymers customarily formed in the prior art lack this important characteristic. The thermotropic liquid crystalline polymers of the prior art are routinely formed by techniques whereby the requisite reactive groups, which form for example ester groups along the polymer chain, are carefully reacted so as to provide a stoichiometric balance of reactive groups. For instance, if a relatively volatile monomer, such as hydroquinone or hydroquinone diacetate, is employed as a reactant, an excess of this monomer sometimes is provided to compensate for the quantity of this reactant which is evolved and lost by volatilization through the use of the specific polymerization conditions selected. When the various ester-forming monomers are provided and react with each other under stoichiometrically balanced conditions, a polymer is produced having the random presence of the requisite ester-forming groups at the ends of the polymer chains. These end groups unless otherwise end capped in a further reaction step have the propensity upon subsequent thermal processing (e.g. injection molding extruding, compounding, etc.) to react with each other and to cause the polymer chains to continue to grow in length. The thermal processing of such polymers to increase the molecular weight in the solid state is disclosed, for example, in U.S. Pat. Nos. 3,975,487;

4,183,895; and 4,247,514. The continued polymerization via a condensation reaction results in the simultaneous evolution or off-gassing of relatively small molecular by-products and may result in a significant elevation in the melt viscosity of the resulting polymer upon any subsequent melt processing. In accordance with the concept of the present invention it is essential that such off-gassing not occur to any substantial degree during encapsulation. The formation of an impervious substantially void-free product is thus assured. Also, a relatively constant melt viscosity is assured which contributes to the uniformity and quality of the resulting encapsulated electronic devices.

According to a possible synthesis technique once the melt processable polymer which forms an anisotropic melt phase assumes the requisite weight average molecular weight during its formation via polymerization, the polymer chains may be appropriately end-capped through the introduction of an end-capping agent to substantially prevent further chain growth in the future. For instance, mono-functional end-capping reactants may be employed.

In accordance with a particularly preferred embodiment of the present process the melt processable polymer which is capable of forming an anisotropic melt phase is formed in accordance with the concept of commonly assigned U.S. Ser. No. 517,865, filed July 27, 1983 (now U.S. Pat. No. 4,539,386), of Hyun-Nam Yoon which is entitled "Improved Process for Forming Thermally Stable Thermotropic Liquid Crystalline Polyester of Predetermined Chain Length" and which is herein incorporated by reference.

More specifically, when the melt processable polymer is a polyester which optionally may include amide linkages it preferably was formed through a polymerization reaction in a polymerization zone of ester-forming and optionally also amide-forming monomers to yield a polymer having recurring moieties selected from the group consisting of the following where in each instance Ar comprises at least one aromatic ring:

(a)

(b) —O—Ar—O—, (c)

(d) —Y—Ar—Z—, where Y is O, NH, or NR, and Z is NH or NR where R is an alkyl group of 1 to 6 carbon atoms or an aryl group, (e)

where Z is NH or NR where R is an alkyl group of 1 to 6 carbon atoms or an aryl group, and (f) mixtures of the foregoing;

and wherein there was provided in the polymerization zone during said polymerization reaction an approximately 1 to 4 percent molar excess of aromatic dicarboxylic acid monomer and/or an esterified derivative thereof which during the polymerization reaction imparted dicarboxyaryl units to the interior of the polymer chains of the resulting polymer and caused the polymer chains to terminate in carboxylic acid end groups and/or an esterified derivative thereof wherein the polymer chains achieved the required molecular weight through the depletion of other monomers present in the polymerization zone to yield a polyester product which was substantially incapable of additional chain growth upon subsequent heating.

Any of the polyester-forming monomers which are capable of forming a polyester which exhibits an optically anisotropic melt phase may be employed in such process. Amide-forming monomers optionally may additionally be present whereby a poly(ester-amide) is formed which exhibits an optically anisotropic melt phase. Minor quantities of carbonate-forming monomers may be included provided they do not adversely influence the ability of the resulting polyester to exhibit an optically anisotropic melt phase. In a preferred embodiment the resulting polymer is wholly aromatic in the sense that each moiety present therein contributes at least one aromatic ring.

As indicated, a possible monomer for selection when forming the polyester in accordance with such process is one which imparts

recurring moieties to the polymer chain where Ar comprises at least one aromatic ring. In a preferred embodiment Ar is 1,4-phenylene or 2,6-naphthalene. Accordingly, the moiety is a 4-oxybenzoyl moiety or a 6-oxy-2-naphthoyl moiety in such instances. The polyester may include a plurality of different recurring moieties where Ar is different in each and where each moiety satisfies the above general formula, such as a combination of 1,4-phenylene and 2,6-naphthalene. Such monomers are inherently stoichiometrically balanced since they contain precisely the correct quantity of ester-forming reactant groups. The aromatic ring or rings present optionally may include substitution of at least some of the hydrogen atoms present thereon. Such substitution may be selected from an alkyl group of 1 to 4 carbon atoms, an alkoxy group of 1 to 4 carbon atoms, halogen (e.g. Cl, Br, I), phenyl, and mixtures of the foregoing. Particularly preferred moieties may be derived from 4-hydroxybenzoic acid and 6-hydroxy-2-naphthoic acid. Representative ring substituted moieties include 2-chloro-4-hydroxybenzoic acid, 2,3-dichloro-4-hydroxybenzoic acid, 3,5-dichloro-4-hydroxybenzoic acid, 2,5-dichloro-4-hydroxybenzoic acid, 3-bromo-4-hydroxybenzoic acid, 3-methyl-4-hydroxybenzoic acid, 3,5-dimethyl-4-hydroxybenzoic acid, 2,6-dimethyl-4-hydroxybenzoic acid, 3-methoxy-4-hydroxybenzoic acid, 3,5-dimethyl-4-hydroxybenzoic acid, 3-phenyl-4-hydroxybenzoic acid, 2-phenyl-4-hydroxybenzoic acid, 6-hydroxy-5-chloro-2-naphthoic acid, 6-hydroxy-5-methyl-2-naphthoic acid, 6-hydroxy-5-methoxy-2-naphthoic acid, 6-hydroxy-4,7-dichloro-2-chloro-2-naphthoic-acid, etc. Other non-ring substituted moieties may be derived from 3-hydroxybenzoic acid and 4-hydroxybiphenyl-4'-carboxylic acid.

As indicated, a possible monomer for selection when forming such polyester is one which imparts —O—Ar—O— recurring moieties to the polymer chain where Ar comprises at least one aromatic ring. Representative moieties include:

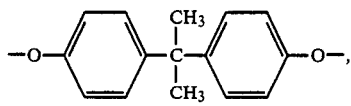

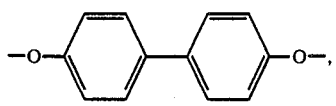

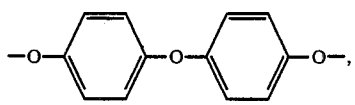

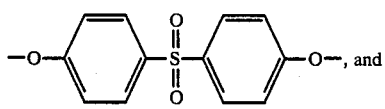

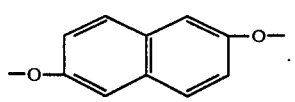

In a preferred embodiment Ar is 1,4-phenylene, 2,6-naphthalene, or 4,4'-biphenyl. The polyester may include a plurality of different recurring moieties where Ar is different in each and where each moiety satisfies the above general formula. The aromatic ring or rings present optionally may include substitution of at least some of the hydrogen atoms present thereon as discussed in connection with the first described moiety. Examples of moieties which include ring substitution are those derived from phenylhydroquinone, methylhydroquinone, and chlorohydroquinone. Particularly preferred moieties may be simply derived from hydroquinone, 2,6-dihydroxynaphthalene, and 4,4'-biphenol.

As indicated, a possible monomer for selection when forming such polyester is one which imparts

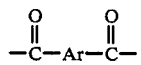

recurring moieties to the polymer chain where Ar comprises at least one aromatic ring. Representative moieties include:

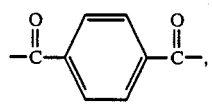

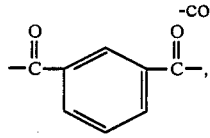

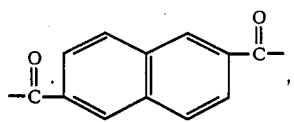

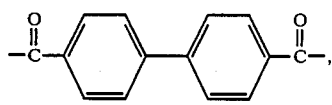

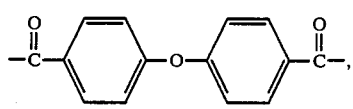

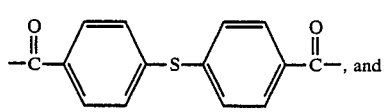

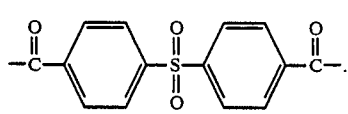

In a preferred embodiment Ar is 1,4-phenylene or 2,6-naphthalene the polyester may include a plurality of different recurring moieties where Ar is different in each and where each moiety satisfies the above general formula. The aromatic ring or rings present optionally may include substitution of at least some of the hydrogen atoms present thereon as discussed in connection with the first described moiety. An example of a moiety which includes ring substitution is that derived from phenyl-substituted terephthalic acid. Particularly preferred moieties may be simply derived from terephthalic acid and 2,6-naphthalenedicarboxylic acid.

As indicated, another possible monomer for selection when forming a polyester in accordance with such process is one which imparts —Y—Ar—Z— recurring moieties to the polymer chain where Ar comprises at least one aromatic ring and where Y is O, NH, or NR, and Z is NH or NR where R is an alkyl group of 1 to 6 carbon atoms or an aryl group. R is preferably a straight chain alkyl group of 1 to 6 carbon atoms and is more preferably a methyl group. This monomer will impart amide linkages to the polymer chain. In a preferred embodiment Ar is 1,4-phenylene. The polyester may include a plurality of different recurring moieties where Ar is different in each and where each satisfies the above general formula. The aromatic ring or rings present optionally may include substitution of at least some of the hydrogen atoms present thereon as discussed in connection with the first described moiety. Examples of monomers from which this moiety may be derived include p-aminophenol, p-N-methylaminophenol, p-phenylenediamine, N-methyl-p-phenylenediamine, N,N'-dimethyl-p-phenylenediamine, m-aminophenol, 3-methyl-4-aminophenol, 2-chloro-4-aminophenol, 4-amino-1-naphthol, 4-amino-4'-hydroxydiphenyl, 4-amino-4'-hydroxydiphenyl ether, 4-amino-4'-hydroxydiphenyl methane, 4-amino-4'-hydroxydiphenyl ethane, 4-amino-4'-hydroxydiphenyl sulfone, 4-amino-4'-hydroxy diphenyl sulfide, 4,4'-diaminophenyl sulfide (thiodianiline), 4,4'-diaminodiphenyl sulfone, 2,5-diaminotoluene, 4,4'-ethylenedianiline, 4,4'-diaminodiphenoxyethane, etc. Particularly preferred moieties may be derived from p-aminophenol.

As indicated, a further possible monomer for selection when forming a polyester in accordance with such process is one which imparts

recurring moieties to the polymer chain where Ar comprises at least one aromatic ring and where Z is NH or NR where R is an alkyl group of 1 to 6 carbon atoms or an aryl group. R is preferably a straight chain alkyl group of 1 to 6 carbon atoms and is more preferably a methyl group. Such monomer will impart amide linkages to the polymer chain. These monomers are inherently stoichiometrically balanced since they contain precisely the correct quantity of ester-forming or amide-forming reactant groups. In a preferred embodiment Ar is 1,4-phenylene. The polyester may include a plurality of different recurring moieties where Ar is different in each and where each satisfies the above general formula. The aromatic ring or rings present optionally may include substitution of at least some of the hydrogen atoms present thereon as discussed in connection with the first described moiety. Examples of monomers from which this moiety may be derived include p-aminobenzoic acid, p-N-methylaminobenzoic acid, m-aminobenzoic acid, 3-methyl-4-aminobenzoic acid, 2-chloro-4-aminobenzoic acid, 4-amino-1-naphthoic acid, 4-N-methylamino-1-naphthoic acid, 4-amino-4'-carboxydiphenyl, 4-amino-4'-carboxydiphenyl ether, 4-amino-4'-carboxydiphenyl suflone, 4-amino-4'-carboxydiphenyl sulfide, p-aminocinnamic acid, etc. Particularly preferred moieties may be derived from p-aminobenzoic acid.

Any of the thermotropic liquid crystalline polyesters of the prior art may be formed in a thermally stable modified form in accordance with such process, such as those identified previously. Highly satisfactory polyesters which may be produced in a modified form in accordance with the concept of such process are disclosed in commonly assigned U.S. Pat. Nos. 4,161,470; 4,184,996; 4,219,461, 4,256,624; 4,330,457; and 4,351,917; and in commonly assigned copending U.S. Ser. No. 485,820, filed Apr. 18, 1983 (now U.S. Pat. No. 4,473,682). The thermotropic liquid crystalline polyesters of U.S. Pat. Nos. 4,330,457 and 4,351,917 additionally include amide linkages.

In accordance with such concept all ester-forming and amide-forming monomers are added to the polymerization zone in carefully measured quantities so that during the course of the polymerization there is provided an approximately 1 to 4 percent molar excess of aromatic dicarboxylic acid monomer and/or an esterified derivative thereof. In a preferred embodiment the aromatic dicarboxylic acid is provided during the course of the polymerization reaction in a molar excess of approximately 2.0 to 4.2 percent. It is essential that this molar excess of aromatic dicarboxylic acid monomer (and/or an esterified derivative thereof) be provided during the polymerization reaction in excess of the other monomer quantities which are sufficient to provide a stoichiometric balance between all carboxylic acid reactive groups (and/or an esterified derivative thereof) and the hydroxyl reactive groups (and/or an esterified derivative thereof) plus any amine reactive groups (and/or an amidated derivative thereof).

Preferred aromatic dicarboxylic acid monomers which are provided in the specified molar excess are terephthalic acid, isophthalic acid, 2,6-naphthalene dicarboxylic acid, 2,7-naphthalene dicarboxylic acid, 1,4-naphthalene dicarboxylic acid, 2-phenylterephthalic acid, 4,4'-bibenzoic acid, etc.

During the course of the polymerization reaction in accordance with such process dicarboxyaryl units derived from such molar excess of aromatic dicarboxylic acid monomer and/or an esterified derivative thereof are incorporated into the interior of the polymer chains of the resulting polymer and cause the polymer chains to terminate in carboxylic acid groups and/or an esterified derivative thereof. As the polymerization reaction progresses, the other monomers present in the polymerization zone are fully depleted. The average polymer chain length achieved is directly controlled by the molar excess quantity of aromatic dicarboxylic acid monomer and/or its esterified derivative provided in the polymerization zone during the course of the polymerization reaction. As the molar excess quantity of dicarboxylic acid monomer and/or its esterified derivative increases within the range specified, the average polymer chain length decreases. As the molar excess quantity of dicarboxylic acid monomer and/or its esterified derivative decreases within the range specified, the average polymer chain length increases. A polymer product of the predetermined average chain length is produced by such process through the selection of the specific molar excess utilized. Such average chain length in many instances may be conveniently evidenced by the inherent viscosity of the resulting polymer as well as by its weight average molecular weight. In all instances the polymer chains of the resulting thermotropic liquid crystalline polyester terminate in carboxylic acid end groups and/or an esterified derivative thereof. Such product is thermally stable since the like end groups are substantially incapable of additional polymer chain growth through a polymerization reaction of adjoining molecules upon subsequent heating at the melt processing temperature.

Such polyester may be formed by a variety of ester-forming techniques whereby organic monomer compounds possessing functional groups which upon condensation form the requisite recurring moieties are reacted. For instance, the functional groups of the organic monomer compounds may be carboxylic acid groups, hydroxyl groups, ester groups (e.g. acyloxy groups), acid halides, etc. The organic monomer compounds may be reacted in the absence of a heat exchange fluid via a melt acidolysis procedure. They, accordingly, may be heated initially to form a largely melt solution of the reactants wherein some reactants such as terephthalic acid initially are present to some degree as solids. Low levels of terephthalic acid may be dissolve under such circumstances. The polymer product sometimes is suspended therein as solid polymer particles. A vacuum may be applied to facilitate removal of volatiles formed during the final stage of the condensation (e.g., acetic acid or water) and to otherwise expedite the polymerization.

In commonly assigned U.S. Pat. No. 4,067,852 of Gordon W. Calundann, entitled "Melt Processable Thermotropic Wholly Aromatic Polyester Containing Polyoxybenzoyl Units" is described a slurry polymerization process which may be employed to form such polyester wherein the solid product is suspended in a heat exchange medium. The disclosure of this patent is herein incorporated by reference.

When employing either the melt acidolysis procedure or the slurry procedure of U.S. Pat. No. 4,067,852 the monomer reactants from which the polymer moieties are derived which would otherwise include a hydroxyl and/or an amine group are preferably preliminarily esterified. For instance, they may be provided as lower acyl esters of about 2 to about 4 carbon atoms. Most preferably the acetate esters of such monomers which would otherwise include a hydroxyl group and/or an amine group are provided. Examples of such reactants are 6-acetoxy-2-naphthoic acid, 4-acetoxybenzoic acid, hydroquinone diacetate, 4,4'-biphenol diacetate, etc.

Alternatively, any monomers which impart carboxyaryl units to the resulting polymer chain such as the aromatic dicarboxylic acid monomer which is provided in molar excess may be provided initially in an esterified form. For instance, they may first be reacted with an aromatic monohydroxy compound such as phenol, m-cresol, p-cresol, etc. as described, for example, in U.S. Pat. No. 4,333,907. Examples of such reactants are phenyl p-hydroxybenzoate, and diphenyl terephthalate. In a preferred embodiment the carboxylic acid groups of the reactants are non-esterified.

Representative catalysts which optionally may be employed in either the melt acidolysis procedure or in the procedure of U.S. Pat. No. 4,067,852 include dialkyl tin oxide (e.g., dibutyl tin oxide), diaryl tin oxide, titanium dioxide, alkoxy titanium silicates, titanium alkoxides, alkali and alkaline earth metal salts of carboxylic acids, the gaseous acid catalysts such as Lewis acids (e.g., BF$_3$), hydrogen halides (e.g., HCl), etc. The quantity of catalyst utilized typically is about 0.001 to 1 percent by weight based upon the total monomer weight, and most commonly about 0.01 to 0.2 percent by weight.

The polymerization procedures of commonly assigned U.S. Pat. Nos. 4,393,191; 4,395,536; 4,421,908; and 4,429,105 also are suitable for use when carrying out such process.

When the melt processable polymer is a modified wholly aromatic polyester of U.S. Pat. No. 4,161,470, in a particularly preferred embodiment it was formed through a polymerization reaction in a polymerization zone of ester-forming monomers to form a polymer which consisted essentially of moieties I and II wherein:

I is

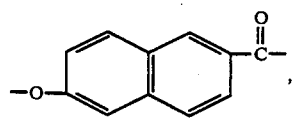

and
II is

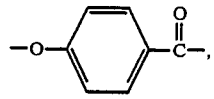

wherein said polyester comprised approximately 20 to 45 mole percent of moiety I, and approximately 55 to 80 mole percent of moiety II, and wherein there was provided in the polymerization zone during said polymerization reaction an approximately 1 to 4 percent molar excess of aromatic dicarboxylic acid monomer which during the polymerization reaction imparted dicarboxyaryl units to the interior of the polymer chains of the resulting polymer and caused the polymer chains to terminate in carboxylic acid end groups wherein the polymer chains achieved the required molecular weight through the depletion of other monomers present in the polymerization zone to yield a wholly aromatic polyester product which was substantially incapable of additional chain growth upon subsequent heating.

When the melt processable polymer is a modified wholly aromatic polyester which also includes amide linkages of U.S. Pat. No. 4,330,457, in a further particularly preferred embodiment it was formed through a polymerization reaction of ester-forming and amide-forming reactants to form a polymer which consists essentially of moieties I, II, III, and optionally IV, wherein in each instance Ar is at least one aromatic ring, and wherein:

I is

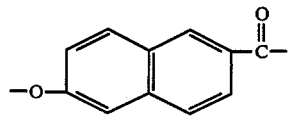

II is

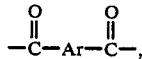

III is —Y—Ar—Z—, where Y is O, NH, or NR, and Z is NH or NR where R is an alkyl group of 1 to 6 carbon atoms or an aryl group, and IV is —O—Ar—O—, wherein said poly(ester-amide) comprised approximately 40 to 80 mole percent of moiety I, approximately 5 to 30 mole percent of moiety II, approximately 5 to 30 mole percent of moiety II, and approximately 0 to 25 mole percent of moiety IV; and wherein there was provided in the polymerization zone during said polymerization reaction an approximately 1 to 4 percent molar excess of aromatic dicarboxylic acid monomer which during the polymerization reaction imparted dicarboxyaryl units to the interior of the polymer chains of the resulting polymer and caused the polymer chains to terminate in carboxylic acid end groups wherein the polymer chains achieved the required molecular weight through the depletion of other reactants present in the polymerization zone to yield a wholly aromatic poly(esteramide) product which is substantially incapable of additional chain growth upon subsequent heating.

When the melt processable polymer which is capable of forming an anisotropic melt phase is formed in accordance with the previously referenced process of copending Ser. No. 517,865 (now U.S. Pat. No. 4,539,386), of Hyun-Nam Yoon, it preferably additionally exhibits an inherent viscosity of no more than 3.0 dl./g. (and most preferably approximately 0.8 to 3.0 dl./g. when dissolved in a concentration of 0.1 percent by weight in pentafluorophenol at 60° C. prior to being admixed with the particulate inorganic material. It should be understood, however, that not all polymeric products will be sufficiently soluble in pentafluorophenol to carry out this inherent viscosity determination.

Other representative techniques for forming the melt processable polymer which is capable of forming an anisotropic melt phase, which is substantially incapable of further chain growth upon heating, and which may be employed in the present process are disclosed commonly assigned (1) U.S. Ser. No. 595,004, filed Mar. 29, 1984 (now U.S. Pat. No. 4,562,244), of Hyun-Nam Yoon entitled "Improved Process for Forming Thermally Stable Thermotropic Liquid Crystalline Polyesters of Predetermined Chain Length Utilizing Aliphatic Dicarboxylic Acid", and (2) U.S. Ser. No. 611,299, filed May 17, 1984 (now U.S. Pat. No. 4,567,247), of Hyun-Nam Yoon entitled "Improved Process for Forming Thermally Stable Thermotropic Liquid Crystalline Polyesters of Predetermined Chain Length Utilizing Aromatic Hydroxyl Monomer and/or Aromatic Amine Monomer". The disclosures of these copending applications are herein incorporated by reference.

The melt processable polymer will preferably exhibit a melt viscosity of approximately 30 to 300 poise at the melt processing temperature (e.g. 300° C., 310° C., 320° C., or 330° C.) and at a shear rate of 100 sec.$^{-1}$ prior to admixture with the particulate inorganic material. Such melt viscosity may be determined by standard techniques using an Instron capillary rheometer having a capillary which measures 4 inches in length and has an inner diameter of 30 mils. Alternatively, one may employ a Rheometrics mechanical spectrometer to determine melt viscosity using parallel plates in the steady shear mode at a shear rate of 10 sec.$^{-1}$. The melt processable polymer should be completely melted at the time of the melt viscosity determination. When conducting the melt viscosity determination at 300° C., a more homogeneous melt can be obtained if the polymer is first heated to approximately 320° C. and is then cooled to 300° C. at which temperature the melt viscosity determination is made.

Regardless of the synthesis route selected the melt processable polymer which is selected preferably should be capable of forming the required anisotropic melt phase at a temperature in the range of approximately 200° to 480° C., and most preferably in the range of approximately 200° to 350° C. prior to being admixed with the particulate inorganic material. The melt processable polymer should be free of deleterious levels of contamination and preferably is inherently non-burning in addition to exhibiting a resistance to light (especially ultraviolet light), solvents, chemicals, and environments which are encountered during the formation, assembly, and prolonged use of the encapsulated electronic component.

The second essential component of the molding composition in accordance with the concept of the present invention is the particulate inorganic material (i.e. a mineral filler) which is substantially uniformly dispersed in the melt processable polymer previously described and which is capable of decreasing the volumetric coefficient of thermal expansion and increasing the thermal conductivity of the melt processable polymer (i.e. of the composition in the absence of the particulate inorganic material). The presence of the particulate inorganic material also renders the volumetric coefficient of thermal expansion of the final product to be more isotropic in nature. While the particulate material may be selected from a wide variety of solid inorganic substances, such as silicon dioxide, talc, wollastonite, alumina, cordierite, etc., certain forms of silicon dioxide are preferred. The weight average particle size of the particulate inorganic material is preferably approximately 1 to 50 microns with at least 99 percent by weight of the particles being below 100 microns. Suitable particle size analyzers for use when making such particle size determination are available from Micrometrics Instrument Corporation of Norcross, Ga. and the Leeds and Northrup Corporation of St. Petersburg, Fla. (Microtrac particle size analyzer). Such material also preferably exhibits substantially the same dimensions in all directions so as to eliminate the possible creation of anisotropy in thermal expansion following the molding of the particles in an aligned configuration. Accordingly, the particulate inorganic material preferably has an average aspect ratio of no more than 2:1 as determined by conventional optical microscopy.

It is essential that the particulate inorganic material be free of deleterious levels of contamination which would harm or interfere with the operation of the electronic component, and to preferably have as low a volumetric coefficient of thermal expansion as possible. Accordingly, fused silica is the particularly preferred particulate inorganic material for use in the present invention. As is well known, fused silica is composed of a relatively pure form of silicon dioxide which has been converted through the use of very high temperatures commonly involving electric arc melting from its usual crystalline to an amorphous form. Such inorganic particulate material is sometimes called fused quartz. The resulting fused particles following their formation are ground to the desired particle size. Such material exhibits a volumetric coefficient of thermal expansion which is practically zero, and can undergo rapid and extreme temperature changes without creating internal stresses. Such fused silica is commercially available, and may be obtained from Harbison-Walker Refractories of Pittsburgh, Pa., under the designation GP7I. Minor amounts of crystalline silica may be blended with the fused silica in order to further increase its thermal conductivity if desired. The presence of crystalline silica will, however, tend to increase to some degree the volumetric coefficient of thermal expansion of the overall composition. In some applications where the electronic component undergoing encapsulation is not particularly fragile, discontinuous glass fibers or other similar fibrous reinforcement may be included with the particulate inorganic material. Also, colorants, additives, adhesion promoters, lubricants, etc. may be included so long as they do not deleteriously influence the composition.

In a preferred embodiment the particulate inorganic material additionally bears a coating upon its surface which increases its ability to admix with the melt processable polymer which is capable of forming an anisotropic melt phase. Any coating selected must be incapable of harming the electronic component or interfering with its operation during use. Representative coatings are the silanes such as gamma-glycidoxypropyltrimethoxysilane and gamma-aminopropyltriethoxysilane available from the Union Carbide Corporation under the designations A187 and A1100 respectively. Such silanes may be applied as surface coatings to the particulate inorganic material in concentrations of approximately 0.5 to 1.5 percent by weight in accordance with standard coating technology for mineral fillers. Organotitanate surface coatings may be similarly applied to the inorganic particles prior to blending with the melt processable polymeric material which is capable of forming an anisotropic melt phase.

In accordance with the concept of the present invention the particulate inorganic material is blended with and substantially uniformly dispersed within the melt processable polymer which is capable of forming an anisotropic melt phase in a concentration of approximately 40 to 80 percent by weight based upon the total weight of the molding composition, and most preferably in a concentration of approximately 50 to 75 percent by weight (e.g. approximately 55 to 70 percent by weight) based upon the total weight of the molding composition. Such substantially uniform dispersal may be accomplished by known techniques wherein the particulate material is forced within the moving molten polymeric material. Known melt compounding techniques using single screw extruders, co-rotating twin screw extruders, counter-rotating twin screw extruders, kneaders, etc. may be employed. For instance, a co-rotating twin screw extruder manufactured by Werner & Pfleiderer Corporation of Ramsey, N.J. may be employed. When using such equipment, preformed polymer pellets and the particulate inorganic material may be simply fed as a dry blend into the extruder and heated to above the melting temperature of the polymeric material. Kneading blocks advantageously may be included within the screw to aid in the blending. When introducing the particulate inorganic material at high concentration levels, a multiple pass (e.g. a two or more pass) blending operation may be employed with only a portion of the particulate inorganic material being introduced during the first pass. Alternatively, the blend of anisotropic melt-forming polymer and the particulate inorganic material can be prepared by adding the entire volume of inorganic material to the molten polymer by feeding the particles into one or more feed ports located downstream on a compounding extruder, such as a Buss-Condux Kneader manufactured by Buss-Condux of Elk Grove Village, Ill., or other extruder capable of downstream addition of particles. Using this procedure, the polymer is fed into the rear of the extruder, melted, and then blended with the particles. With either type of blending process, the resulting molding composition may be pelletized using either a strand or a dieface pelletizing procedure. With a strand procedure, a strand of the resulting molding composition may be extruded and pelletized following passage through an air quench. The melt extruded strand may be transported on a conveyor between the extruder and the pelletizing operation. With a die-face cutter, the molding composition may be cut into pellets at the face of the die, with the pellets then being dropped into water to cool.

The resulting molding composition commonly is capable of being injection molded at a temperature within the range of approximately 250° to 390° C. Also, the resulting molding composition preferably includes less than 50 parts per million of water-extractable alkali metal (e.g. Na and K), and less than 100 parts per million of water-extractable halogen (e.g. Cl, Br, F). Accordingly, charged species are not present which would interfere with the delicate electrical balance often required during the operation of an encapsulated electronic component of some types. The quantity of water-extractable alkali metals and halogens present may be determined by following the Recommended Practice for Aqueous Extraction of Ionic Species (Section G5.3) in the Book of SEMI Standards published by the Semiconductor Equipment and Materials Institute, Vol. 4, Packaging Division (1983).

When carrying out the encapsulation of an electronic component in accordance with the concept of the present invention, the preformed electronic component may be positioned (i.e. secured) within a mold cavity in a manner directly analogous to that employed in prior injection packaging techniques (including transfer molding methods) for such components. If desired, a plurality of electronic components may be positioned in a multicavity mold where each electronic component is individually encapsulated. The molding composition while at an elevated temperature next is caused to completely fill the mold cavity surrounding the electronic component while the melt processable polymer is in the molten state and the particulate inorganic material is dispersed therein. It should be understood, however, that predetermined portions of the electronic component, such as its electrical contacts, etc., may extend outside the area which is surrounded by the molding composition.

As the liquid crystalline polymer of the molding composition is injected within the mold cavity, the molecules thereof are believed inherently to tend to locally orient in a manner which ultimately imparts strength and stiffness to the encapsulant in spite of its relatively low molecular weight. The flow of the molten polymer readily causes its orientation. Such local orientation is not lost to any significant degree prior to solidification because of the very long relaxation times associated with such polymers. Accordingly, the mechanical properties of the resulting article are advantageously influenced by the thermotropic properties of the molten polymer present in the molding composition.

The molding composition preferably exhibits a melt viscosity within the range of approximately 300 to 2500 poise at the injection molding temperature while at a shear rate of 100 sec.$^{-1}$, and most preferably exhibits a melt viscosity within the range of approximately 300 to 1500 poise under such conditions.

An alternate technique for assessing the moldability characteristics of the molding composition is described in the Spiral Flow Test of ASTM D3132-72 as modified by the use of a conventional injection molding machine, a spiral flow mold having a ¼ inch diameter one-half round geometry with a 50 inch flow length, a mold temperature of 100° C., and an injection pressure of 8000 psi. Typical flow lengths for the molten polymer obtained under these conditions commonly range from approximately 10 to 45 inches. The polymers which exhibit the longer flow lengths are more suitable for encapsulating delicate electronic components.

The rate at which the remaining space in the mold cavity is filled by the molding composition will be influenced by the size and structural properties of the electronic component. Mold fill times of approximately 2 to 15 seconds commonly are selected within a total molding cycle of less than one minute (e.g. approximately 15 to 50 seconds). Often relatively delicate electronic components, such as integrated circuit devices, require a substantially slower filling rate than a more rugged electronic components, such as a single-functioned transistor. Care is taken not to deleteriously deflect portions of the electronic component undergoing encapsulation. The minimum mold cavity fill time preferably is selected in each instance which is found not to damage the electronic component.

In order to aid in the complete filling of the mold cavity with the molding composition and to thereby aid in the creation of an impervious encapsulation, the mold itself preferably also is provided at an elevated temperature while it is being filled. Accordingly, the molding composition is prevented from cooling unduly prior to the complete filling of the mold cavity. The choice of the temperature of the mold and the temperature of the molding composition during the mold filling step will be influenced by the melting temperature of the melt processable polymer which is capable of forming an anisotropic melt phase and the temperature required to achieve a melt viscosity which will completely fill the mold cavity with ease. The melt viscosity will in turn be influenced by the concentration and the particle size distribution of the particulate inorganic material dispersed in the molding composition and the weight average molecular weight of the melt processable polymer. Optimum conditions for a given encapsulation run within the parameters stated can be determined by routine experimentation and are influenced by the gate size, runner length and size, and other geometric factors related to the design of the specific mold being utilized. Commonly, the mold cavity is provided at a temperature of approximately 100° to 250° C. and the molding composition is introduced into the mold cavity at a temperature of approximately 250° to 390° C. while under a pressure of approximately 100 to 1000 psi.

Representative apparatus for carrying out the encapsulation include (1) a 1 or 2 ounce, 35 or 40 ton clamp capacity Arburg Model 220 screw injection molding machine, and (2) a 5 ounce, 80 ton clamp capacity Windsor Model HSI 80 screw injection molding machine. A process controller can be used to advantage to provide positive feedback position control of the injection molding ram and to thereby control the filling rate in view of the relatively low pressures commonly employed. The use of short runners and generously proportioned gates is recommended in order to reduce the pressure during flow and to ease the molding process.

Once the mold is completely filled with the molding composition, the molding composition solidifies therein to form an impervious package around the desired portion of the electronic component. The polymer employed is thermally stable and does not evolve to any substantial degree volatile void-forming components during the molding operation, such as would occur if substantial further polymerization or degradation took place. The melt viscosity of the molding composition remains substantially constant. The creation of an impervious encapsulation is assured. Additionally, no polymer curing step is required subsequent to the solidification of the polymer in the mold cavity.

Following the injection molding of the molding composition it preferably exhibits a volumetric coefficient of thermal expansion of no more than $150 \times 10^{-6}$ cm.$^3$/cm.$^3$°C. at 60° to 110° C., and most preferably no more than $90 \times 10^{-6}$ cm.$^3$/cm.$^3$°C. at such conditions. This is important since most electronic devices generate some heat during operation and the resulting thermally induced stresses if too extreme may cause cracking of the previously impervious encapsulant resulting in its failure. Also, bonding wires may be pulled from integrated circuit pads, wire bonds may be broken due to fatigue, or circuit conductors may loosen and be broken from the surface of the integrated circuit chip. The lesser values are achieved with the inclusion of the greater quantities of the particulate inorganic material in the molding composition. The particulate inorganic material renders the volumetric coefficient of thermal expansion of the polymeric material to be more isotropic in nature. Such volumetric coefficient of thermal expansion may be determined by the Standard Test Method for Expansion Characteristics of Molding Compounds (Section G5.4) in the Book of SEMI Standards published by the Semiconductor Equipment and Materials Institute, Vol. 4, Packaging Division (1983).

The molding composition of the present invention following injection molding exhibits good thermal expansion properties over a relatively broad temperature range (e.g. from −40° C. to 150° C.). These properties tend to be substantially better than those exhibited by epoxy compositions which show an increased thermal expansion above the glass transition temperature.

Following the injection molding of the molding composition it preferably exhibits a thermal conductivity of at least $10 \times 10^{-4}$ cal.-cm./sec.cm.$^2$°C., and most preferably of at least $13 \times 10^{-4}$ cal.-cm./sec.cm.$^2$°C. This is important since high temperatures may deleteriously affect the performance of some electronic components. For instance, heat is known to slow the speed at which integrated circuits operate. The heat generated must be effectively dissipated. The higher thermal conductivity values are achieved with the inclusion of larger quantities of the particulate inorganic material in the molding composition. The thermal conductivity may be determined by standard techniques commonly employed in the industry.

Following the injection molding of the molding composition it also preferably exhibits a V-O burning rating when subjected to the UL-94 test. When subjected to such UL-94 test the molded article should possess a thickness of at least 30 mils. It preferably exhibits good hydrolytic stability as evidenced by a retention of at least 75 percent of the flexural strength thereof following 200 hours in water at 110° C. The encapsulated electronic component additionally will preferably exhibit no change in its electrical characteristics following heating at 85° C. for 1000 hours in air of 85 percent relative humidity.

The encapsulation made possible by the present invention is considered to be impervious in the sense that it is substantially void free and is capable of well protecting the electronic component from liquids and gases which are encountered during service. Moisture cannot penetrate the bulk of the device or travel to the interior of the device by capillary action along leads which extend beyond the encapsulated area. The electronic component is well protected from ultraviolet light.

The mechanical properties (including the flexural strength) of the molding composition following injection molding are sufficient to resist the mechanical stresses involved during trimming and forming and while incorporating the device into a finished assembly. Since products may be formed of highly consistent geometry, they are capable of being inserted in sockets or in printed circuit boards via automation without damage.

The mechanical properties of the molding composition following injection molding are also sufficient to withstand the trimming of waste metal from the lead frame and/or the bending of leads at right angles which extend beyond the encapsulated area. Accordingly stresses exerted at the edges of the encapsulated area of the electronic component may be effectively withstood in the absence of microcracking which would otherwise impair the useful life of the electronic component. The long term performance of the electronic component on a reliable basis is assured by the presence of the encapsulant of the present invention.

The following examples are presented as specific illustrations of the claimed invention. It should be understood, however, that the invention is not limited to the specific details set forth in the examples.

EXAMPLE I

The melt processable polymer capable of forming an anisotropic melt phase selected for use was that formed in accordance with Example II of commonly assigned U.S. Ser. No. 517,865, filed July 27, 1983 now U.S. Pat. No. 4,539,386), of Hyun-Nam Yoon entitled "Improved Process for Forming Thermally Stable Thermotropic Liquid Crystalline Polyesters of Predetermined Chain Length".

More specifically, to a 50 gallon stainless steel reactor equipped with a sealed anchor stirrer, gas inlet tube, and distillation column connected to a condenser were added at room temperature (i.e. approximately 25° C.) the following:

(a) 115 pounds of 6-acetoxy-2-naphthoic acid (0.50 pound mole),
(b) 130.2 pounds of 4-acetoxybenzoic acid (0.745 pound mole),
(c) 4.46 pounds of terephthalic acid (0.0268 pound mole), and
(d) 6.98 grams of potassium acetate catalyst.

It can be calculated that a molar excess of 2.15 percent of terephthalic acid monomer was provided in the reactor. The 6-acetoxy-2-naphthoic acid and 4-acetoxybenzoic acid reactants where inherently stoichiometrically balanced since each provided the required carboxylic acid and acetoxy ester-forming reactant groups in an identical quantity. Accordingly, the terephthalic acid monomer served as an aromatic dicarboxylic acid monomer and provided the ester-forming carboxylic acid groups in a stoichiometric excess beyond the stoichiometric balance which existed with respect to the other monomers present.

The reactor and its contents were thoroughly purged of oxygen by evacuating and refilling with nitrogen three times, and hot oil was next caused to flow through the jacket of the reactor which caused the reactants to melt. The contents of the reactor were heated to 208° C. and were maintained at that temperature for 118 minutes. In 15 minute increments the contents of the reactor were next heated to the following temperatures: 213° C., 220° C., 234° C., 246° C., 259° C., 273° C., 290° C., and 303° C. Then the temperature was raised to 325° C. in 47 minutes.

When the reactant temperature reached 325° C. during the above-identified heating schedule, a vacuum of 8 mm. Hg was applied to the reactants while heating continued. Such heating under vacuum continued for 90 minutes. The vacuum next was broken with nitrogen and the molten polymer product was discharged through a ⅜ inch, three-hole die, immersed in water to form solidified strands, and was pelletized. Approximately 150 pounds of the wholly aromatic polyester product were obtained.

The chains of the resulting polymer included 1,4-dicarboxyphenylene units at interior locations along the length of the polymer chain and terminated in carboxylic acid end groups. When the polymer was heated in either the melt or in the solid phase, no substantial further polymerization or chain growth was observed.

The inherent viscosity (I.V.) of the polymer product was found to be 1.6 dl./g. as determined in a pentafluorophenol solution of 0.1 percent by weight concentration at 60° C. in accordance with the equation:

$$I.V. = \frac{\ln(\eta \text{rel})}{c},$$

where c=concentration of solution (0.1 percent by weight), and $\eta$rel=relative viscosity. The weight average molecular weight was approximately 9,700. When the polymer was subjected to differential scanning calorimetry (20° C./min. heating rate), it exhibited a melt endotherm peak at 236° C. The polymer melt was optically anisotropic and exhibited a melt viscosity of approximately 50 poise at a temperature of 300° C. and a shear rate of 100 sec.$^{-1}$.

The particulate inorganic material selected for use was fused silica which was purchased from Harbison-Walker Refractories of Pittsburgh, Pa., under the GP7I designation. The aspect ratio of such material was substantially 1:1, and its weight average particle size was approximately 12 microns with more than 99 percent by weight of the particles being below 100 microns. Such fused silica additionally was surface treated with a 1 percent by weight coating of gamma-glycidoxypropyltrimethoxysilane using standard coating technology for mineral fillers. This silane coating was available from the Union Carbide Corporation under the A187 designation.

The fused silica was substantially uniformly dispersed in a portion of the wholly aromatic polyester which was capable of forming an anisotropic melt phase in a concentration of 70 percent by weight through the use of a compounding extruder, Model MDK 46 Kneader which was manufactured by Buss-Condux of Elk Grove Village, Ill. The polymer pellets were fed into the rear of the extruder. The fused silica was metered into the second feed port downstream on the extruder. The barrel temperatures were maintained at 250° C. A screw rotation of 300 RPM was employed. The blended material was fed out of a 3-hole die with hole diameters of 4.5 mm. at a rate of approximately 22 lbs./hr. and was chopped into pellets using a single blade eccentric dieface pelletizer. The pellets were then sprayed with water to cool the material to room temperature.

The resulting molding composition exhibited a melt viscosity of 900 poise at 330° C. (i.e. the approximate encapsulation temperature to be used later) while under a shear rate of 100 sec.$^{-1}$. The molding composition also included less than 50 parts per million of water-extractable alkali metal, and less than 100 parts per million of water-extractable halogen.

Precision wire wound resistors may be selected for encapsulation. The wound wire portion of the resistors is provided on a coil which is capable of resisting deformation at 350° C. On each resistor a pair of axially disposed leads are attached in a conventional manner to pretinned copper lead wires of 24 gauge (i.e. 0.020 inch diameter) by secure bonds which adhere well at 350° C. To aid in handling, a plurality of the resistors to be encapsulated may be mounted in a spaced side-by-side parallel relationship on a tape provided with adhesive and wound on an appropriate supply reel.

The injection molds selected possess dimensions sufficient to permit the complete encapsulation of the wire wound resistors including the leads and bonds which secure the copper lead wires to the leads. The internal mold dimensions are approximately 0.060 inch larger than the electronic component on all sides. The lead wires extend outwardly through thermally resistant slightly compliant seals which form portions of the mold walls. The mold cavities possess about a 5 degree draft angle to aid in the removal of the electronic components following encapsulation. A plurality of the mold cavities are provided in a side-by-side relationship in order to enable the simultaneous encapsulation of a plurality of the electronic components.

A Model 200S screw injection molding machine manufactured by Arburg and distributed by Polymer Machinery Corporation of Berlin, Conn., may be used to introduce the molding composition into the mold cavities. The injection molding machine has a 40 ton clamp and a 2 oz. shot size. The encapsulant may be introduced into the mold cavities by means of a $\frac{1}{4}$ inch full round runner through single gates which are 0.125 inch wide and 0.020 inch high with substantially no land. While the molding composition is at a temperature of approximately 330° C. and at a pressure of about 500 psi, the mold cavities may be filled in approximately one second while the mold cavities are maintained at approximately 125° C. Within a few seconds the molding composition solidifies in each mold cavity. The encapsulated electronic component may be ejected from each mold cavity by means of a 0.125 inch ejection pin and is deflashed.

The resulting injection molded molding composition will exhibit a V-O burning rating when subjected to the UL-94 test, a volumetric coefficient of thermal expansion of no more than $150 \times 10^{-6}$ cm.$^3$/cm.$^3$°C. at 60° to 110° C., a thermal conductivity of at least $10 \times 10^{-4}$ cal. cm./sec. cm.$^2$°C., and hydrolytic stability as evidenced by a retention of at least 75 percent of the flexural strength thereof following 200 hours in water at 110° C.

EXAMPLE II

To a 50 gallon stainless steel reactor equipped with a sealed anchor stirrer, gas inlet pipe, and distillation column connected to a condenser were added at rom temperature (i.e., approximately 25° C.) the following:
 (a) 115 pounds of 6-acetoxy-2-naphthoic acid (0.50 pound mole),
 (b) 126 pounds of 4-acetoxybenzoic acid (0.70 pound mole),
 (c) 8.29 pounds of terephthalic acid (0.050 pound mole), and
 (d) 5.65 grams of potassium acetate catalyst.

It can be calculated that a molar excess of 4.17 percent of terephthalic acid monomer was provided in the reactor. The 6-acetoxy-2-napthtoic acid and 4-acetoxybenzoic acid reactants were inherently stoichiometrically balanced since each provided the required carboxylic acid and acetoxy ester-forming reactant groups in an identical quantity. Accordingly, the terephthalic acid monomer served as an aromatic dicarboxylic acid monomer and provided the ester-forming carboxylic acid groups in a stoichiometric excess beyond the stoichiometric balance which existed with respect to the other monomers present.

The reactor and its contents were thoroughly purged of oxygen by evacuating and refilling with nitrogen three times, and hot oil was next caused to flow through the jacket of the reactor which caused the reactants to melt. The contents of the reactor were heated to 200° C. and were maintained at that temperature for 100 minutes. In 15 minute increments the contents of the reactor were next heated to the following temperatures: 231° C., 244° C., 262° C., 273° C., 292° C., 306° C., 311° C., and 320° C. Then the temperature was maintained at 320° C. for 35 minutes.

After the reactant temperature was maintained at 320° C. during the above-identified heating schedule, a vacuum of 8 mm. Hg was applied to the reactants while heating continued. Such heating under vacuum continued for 60 minutes. The vacuum next was broken and the molten polymer product was discharged through a $\frac{1}{8}$ inch, one-hole die, immersed in water to form solidified strands, and was pelletized. Approximately 138 pounds of the wholly aromatic polyester product were obtained.

The chains of the resulting polymer included 1,4-dicarboxyphenylene units at interior locations along the length of the polymer chains and terminated in carboxylic acid end groups. When the polymer was heated in either the melt or in the solid phase, no substantial further polymerization or chain growth was observed.

The inherent viscosity (I.V.) of the polymer product was found to be 0.99 dl./g. as determined in a pentafluorophenol solution of 0.1 percent by weight concentration at 60° C. as previously described. The weight average molecular weight was approximately 6,100. When the polymer was subjected to differential scanning calorimetry (20° C./min. heating rate), it exhibited an endotherm peak at 221° C. The polymer melt was optically anisotropic and exhibited a melt viscosity of approximately 20 poise at a temperature of 300° C. and a shear rate of 100 sec.$^{-1}$.

The polymer was next blended with fused silica as described in Example I to form a molding composition in accordance with the present invention. The resulting molding composition exhibited a melt viscosity of 420 poise at 330° C. while under a shear rate of 100 sec.$^{-1}$. The molding composition also included less than 50 parts per million of water-extractable alkali metal, and less than 100 parts per million of water-extractable halogen.

A presoldered 16 pin lead frame with dual-in-line integrated circuit devices may be selected for encapsulation. The lead frame strip is plated with a eutectic tin-lead alloy in a 63/37 tin/lead ratio and contains 10 integrated circuits in a row and measures 1 inch$\times$7.5 inches$\times$0.006 inch in thickness. The integrated circuit dies measure approximately $\frac{1}{4} \times \frac{1}{4}$ inch and are cemented to the paddle portion of each of the 10 devices by use of an epoxy adhesive. Each of the 16 pins of each device are attached to the aluminum pads of the integrated circuit dies by delicate gold wires having a diameter of approximately 0.001 inch.

An Engel Model ES50 VHAS 85 ton vertical opening press manufactured by Ludwig Engel Canada, Ltd., of Guelph, Ontario, Canada, may be selected to accomplish the desired encapsulation with the aid of an integral process controller. The injection mold selected has a plurality of cavities connected to central $\frac{1}{4}$ inch round runners which are fed at the parting line from a horizontal injection cylinder. The dimensions of the individual mold cavities measure approximately 0.75 inch × approximately 0.25 inch × approximately 0.117 inch.

The lead frame may be positioned in the mold with the aid of guide pins to position each integrated circuit die at the center of a mold cavity. The mold cavities possess about a 5 degree draft angle to aid in the removal of the electronic components following encapsulation. The molding composition is prevented from leaving the mold between the leads which extend to the outside by "dam bars" or webs positioned between each lead.

Molding conditions may be selected to accommodate the presoldered lead frame. With a melt temperature of approximately 315° C. and at a pressure of approximately 300 psi, the mold cavities surrounding the electronic components may be completely filled over a period of approximately 3.8 seconds. During such introduction of the molding composition, the mold cavity may be held at a temperature of approximately 145° C. Once present in the mold cavity the molding composition solidifies in a few seconds. The encapsulated electronic components may be ejected from cavities by means of 0.150 inch diameter ejection pins.

Following encapsulation the "dam bars" or webs may be removed in a trimming step wherein all of the surplus metal of the lead frame which extends outside the encapsulated area is removed by die cutting. The leads which extend outside the encapsulated area may be bent to their final configuration which facilitates insertion in a socket or in a printed circuit board. The electronic component is imperviously encapsulated.

The resulting injection molded molding composition will exhibit a V-O burning rating when subjected to the UL-94 test, a volumetric coefficient of thermal expansion of no more than $150 \times 10^{-6}$ cm.$^3$/cm.$^3$°C. at 60° to 110° C., a thermal conductivity of at least $10 \times 10^{-4}$ cal. cm./sec. cm.$^2$°C., and hydrolytic stability as evidenced by a retention of at least 75 percent of the flexural strength thereof following 200 hours in water at 110° C.

EXAMPLE III

To a 50 gallon stainless steel reactor equipped with a sealed anchor stirrer, gas inlet pipe, and distillation column connected to a condenser were added at room temperature (i.e. approximately 25° C.) the following:
 (a) 59.0 pounds of 6-hydroxy-2-naphthoic acid (0.31 pound mole),
 (b) 137.4 pounds of 4-hydroxybenzoic acid (1.00 pound mole),
 (c) 9.04 pounds of terephthalic acid (0.054 pound mole), and
 (d) 142 pounds of acetic anhydride (1.39 pounds mole), and
 (e) 5.6 grams of potassium acetate catalyst.

It can be calculated that a molar excess of 4.1 percent of terephthalic acid monomer was provided in the reactor. The 6-hydroxy-2-naphthoic acid and 4-hydroxybenzoic acid reactants where inherently stoichiometrically balanced since each provided the required carboxylic acid and hydroxy ester-forming reactant groups in an identical quantity. Accordingly, the terephthalic acid monomer served as an aromatic dicarboxylic acid monomer and provided the ester-forming carboxylic acid groups in a stoichiometric excess beyond the stoichiometric balance which existed with respect to the other monomers present.

The reactor and its powdery contents were thoroughly purged of oxygen by evacuating and refilling with nitrogen three times, the acetic anhydride was introduced, and hot oil was next caused to flow through the jacket of the reactor which caused the reactants to form a homogeneous liquid solution. The contents of the reactor were heated to 140° C., were maintained at that temperature for 30 minutes, were heated to 200° C. in approximately 40 minutes, and were maintained at 200° C. for another 30 minutes. In 15 minute increments the contents of the reactor were next heated to the following temperatures: 219° C., 246° C., 262° C., 281° C., 300° C., 310° C., 316° C., and 320° C. Then the temperature was maintained at 320° C. for 30 minutes.

After the reactant mixture was maintained at 320° C. during the above-identified heating schedule, a vacuum of 10 mm. Hg was applied to the reactants while heating continued. Such heating under vacuum continued for 120 minutes. The vacuum next was broken with nitrogen and the molten polymer product was discharged through a ⅛ inch, one-hole die, immersed in water to form solidified strands, and was pelletized. Approximately 150 pounds of the wholly aromatic polyester product were obtained.

The chains of the resulting polymer included 1,4-dicarboxyphenylene units at interior locations along the length of the polymer chains and terminated in carboxylic acid end groups. When the polymer was heated in either the melt or in the solid phase, no substantial further polymerization or chain growth was observed.

The inherent viscosity (I.V.) of the polymer product was found to be 0.9 dl./g. as determined in a pentafluorophenol solution of 0.1 percent by weight concentration at 60° C. as previously described. The weight average molecular weight was approximately 6,000. When the polymer was subjected to differential scanning calorimetry (20° C./min. heating rate), it exhibited a melting range from approximately 250° to 305° C. The polymer melt was optically anisotropic and exhibited a melt viscosity of approximately 7 poise at a temperature of 320° C. and a shear rate of 10 sec.$^{-1}$ where measured between the parallel plates of a Rheometrics mechanical spectrometer operating in the steady shear mode.

The polymer was next blended with fused silica as described in Example I to form a molding composition in accordance with the present invention. The resulting molding composition was evaluated using the spiral flow test of ASTM D3123-72 as modified as previously described. At 330° C. a spiral flow length of 24 inches was obtained, and at 340° C., a spiral flow length of 28 inches was obtained. The molding composition also included less than 50 parts per million of water-extractable alkali metal, and less than 100 parts per million of water extractable halogen.

A 40 pin lead frame dual-in-line integrated circuit device may be selected for encapsulation. The lead frame consists of plurality of segments which measure 1⅛ inch by 2¼ inches and is composed of a 0.010 inch prestamped copper sheet. The integrated circuit die measures approximately ¼ × ¼ inch and is cemented to the paddle portion of each segment of the lead frame by use of an epoxy resin. Each of the 40 pins of the lead frame are attached to the pads of the integrated circuit die by delicate gold wires having a diameter of approximately 0.001 inch.

The injection mold selected possesses dimensions to permit the complete encapsulation of the integrated circuit die, the connecting wires, and the associated cantilevered arms of the lead frame. Each half of the mold cavity measures 2.03 inches in length, and 0.54 inch in width. The total thickness of the two halves of the mold cavity measures 0.165 inch which includes the 0.006 inch thickness of the lead frame over which each half of the mold cavity is placed. The mold is designed to incorporate a generous draft angle of about 5 degrees to ease the injection of the encapsulated electronic component. The lead frame is secured in the mold by guide pins which mate with holes stamped in the lead frame to center the die in the cavity. The molding composition is prevented from leaving the mold between the leads which extend outside the mold "dam bars" or webs positioned between each lead.

An Engel Model ES50 VHAS 85 ton vertical press manufactured by Ludwig Engel Canada, Ltd. of Guelph, Ontario Canada, may be used to introduce the molding composition into the multicavity mold with the aid of an integrated process controller. The injection molding machine has an 85 ton clamp and a 5 oz. capacity. The encapsulant is introduced into the mold cavities via parting line injection into ¼ inch runners leading to a single gate for each mold cavity. The gates which measure approximately 0.125 inch × 0.035 inch and have substantially no land are located at the center of each mold cavity on one side. While at a melt temperature of approximately 330° C. and an injection pressure on the molten polymer of approximately 1000 psi, all mold cavities may be filled through the gates over a period of approximately 2½ seconds. During such introduction of the molding composition, the mold cavities may be provided at a temperature of approximately 175° C. Once present in the mold cavity the molding composition solidifies within a few seconds. The electronic component may be ejected from the mold cavity by means of an ejection pin having a diameter of approximately 5/32 inch.

Following encapsulation the "dam bars" or webs may be removed in a trimming step wherein all of the surplus metal of the lead frame which extends outside the encapsulated area is removed by cutting. The leads which extend outside the encapsulated area may be bent to their final configuration which facilitates insertion in a socket or in a printed circuit board. The electronic component is imperviously encapsulated.

The resulting injection molded molding composition will exhibit a V-O burning rating when subjected to the UL-94 test, a volumetric coefficient of thermal expansion of no more than $150 \times 10^{-6}$ cm.$^3$/cm.$^3$°C. at 60° to 110° C., a thermal conductivity of at least $10 \times 10^{-4}$ cal. cm./sec. cm$^2$°C., and hydrolytic stability as evidenced by a retention of at least 75 percent of the flexural strength thereof following 200 hours in water at 110° C.

Although the invention has been described with preferred embodiments it is to be understood that variations and modifications may be employed without departing from the concept of the invention defined in the following claims.

We claim:

1. A molding composition which is particularly suited for use in the impervious encapsulation of an electronic component via injection molding comprising (a) a melt processable polyester which optionally may include amide linkages, is capable of forming an anisotropic melt phase and was formed through a polymerization reaction in a polymerization zone of ester-forming and optionally also amide-forming monomers to yield a polymer having recurring moieties selected from the group consisting of the following where in each instance Ar comprises at least one aromatic ring:

(a)

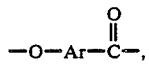

(b) —O—Ar—O—, (c)

(d) —Y—Ar—Z—, where Y is O, NH, or NR, and Z is NH or NR where R is an alkyl group of 1 to 6 carbon atoms or an aryl group, (e)

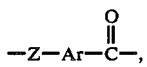

where Z is NH or NR where R is an alkyl group of 1 to 6 carbon atoms or an aryl group, and (f) mixtures of the foregoing;

and wherein there was provided in the polymerization zone during said polymerization reaction an approximately 1 to 4 percent molar excess of aromatic dicarboxylic acid monomer and/or an esterified derivative thereof which during the polymerization reaction imparted dicarboxyaryl units to the interior of the polymer chains of the resulting polymer and caused the polymer chains to terminate in carboxylic acid end groups and/or an esterified derivative thereof wherein the polymer chains achieved the required molecular weight through the depletion of other monomers present in the polymerization zone to yield a polyester product which was substantially incapable of additional chain growth upon subsequent heating, has a weight average molecular weight of approximately 4,000 to 25,000, and which is substantially incapable of further chain growth upon heating, and (b) approximately 40 to 80 percent by weight based upon the total weight of the molding composition of a particulate inorganic material substantially uniformly dispersed in component (a) which is capable of decreasing the volumetric coefficient of thermal expansion and increasing the thermal conductivity of component (a).

2. A molding composition which is particularly suited for use in the impervious encapsulation of an electronic component via injection molding according to claim 1 wherein said melt processable polyester includes not less than about 10 mole percent of recurring units which include a naphthalene moiety.

3. A molding composition which is particularly suited for use in the impervious encapsulation of an electronic component via injection molding according to claim 1 wherein said polymerization reaction was carried out in the melt.

4. A molding composition which is particularly suited for use in the impervious encapsulation of an electronic component via injection molding according to claim 1 wherein any monomer present in the polymerization zone which would otherwise include a hydroxyl group and/or an amine group was provided as a lower acyl ester of about 2 to about 4 carbon atoms.

5. A molding composition which is particularly suited for use in the impervious encapsulation of an electronic component via injection molding according to claim 1 wherein any monomer present in the polymerization zone which would otherwise include a hydroxyl group and/or an amine group was provided as an acetate ester.

6. A molding composition which is particularly suited for use in the impervious encapsulation of an electronic component via injection molding according to claim 1 wherein said melt processable polyester is a wholly aromatic polyester which was formed through a polymerization reaction in a polymerization zone of ester-forming monomers to yield a polymer which consisted essentially of moieties I and II wherein:

I is

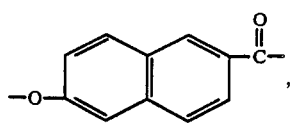

and
II is

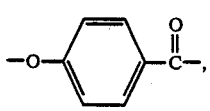

wherein said polyester comprised approximately 20 to 45 mole percent of moiety I, and approximately 55 of 80 mole percent of moiety II, and wherein there was provided in the polymerization zone during said polymerization reaction an approximately 2.0 to 4.0 percent molar excess of aromatic dicarboxylic acid monomer which during the polymerization reaction imparted dicarboxyaryl units to the interior of the polymer chains of the resulting polymer and caused the polymer chains to terminate in carboxylic acid end groups wherein the polymer chains achieved the required molecular weight through the depletion of other monomers present in the polymerization zone to yield a wholly aromatic polyester product which was substantially incapable of additional chain growth upon subsequent heating.

7. A molding composition which is particularly suited for use in the impervious encapsulation of an electronic component via injection molding according to claim 1 wherein said melt processable polyester is a wholly aromatic poly(ester-amide) which was formed through a polymerization reaction in a polymerization zone of ester-forming and amide-forming reactants to yield a polymer which consisted essentially of moieties I, II, III, and optionally IV, wherein in each instance Ar is at least one aromatic ring, and wherein:

I is

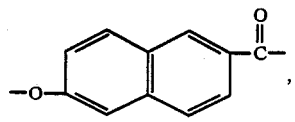

II is

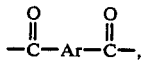

III is —Y—Ar—Z—, where Y is O, NH, or NR, and Z is NH or NR where R is an alkyl group of 1 to 6 carbon atoms or an aryl group, and IV is —O—Ar—O—, wherein said poly(ester-amide) comprised approximately 40 to 80 mole percent of moiety I, approximately 5 to 30 mole percent of moiety II, approximately 5 to 30 mole percent of moiety III, and approximately 0 to 25 mole percent of moiety IV; and wherein there was provided in the polymerization zone during said polymerization reaction an approximately 1 to 4 percent molar excess of aromatic dicarboxylic acid monomer which during the polymerization reaction imparted dicarboxyaryl units to the interior of the polymer chains of the resulting polymer and caused the polymer chains to terminate in carboxylic acid end groups wherein the polymer chains achieved the required molecular weight through the depletion of other reactants present in the polymerization zone to yield a wholly aromatic poly(ester-amide) product which is substantially incapable of additional chain growth upon subsequent heating.

8. A molding composition which is particularly suited for use in the impervious encapsulation of an electronic component via injection molding according to claim 1 wherein said melt processable polyester which is capable of forming an anisotropic melt phase has a weight average molecular weight of approximately 4,000 to 10,000.

9. A molding composition which is particularly suited for use in the impervious encapsulation of an electronic component via injection molding according to claim 1 wherein said particulate inorganic material is present in said molding composition in a concentration of approximately 50 to 75 percent by weight based upon the total weight of the molding composition.

10. A molding composition which is particularly suited for used in the impervious encapsulation of an electronic component via injection molding according to claim 1 wherein said particulate inorganic material has a weight average particle size of approximately 1 to 50 microns with at least 99 percent by weight of the particles being below 100 microns, and an average aspect ratio of no more than 2:1.

11. A molding composition which is particularly suited for used in the impervious encapsulation of an electronic component via injection molding according to claim 10 wherein said particulate inorganic material is particulate silicon dioxide.

12. A molding composition which is particularly suited for use in the impervious encapsulation of an electronic component via injection molding according to claim 11 wherein said particulate silicon dioxide is fused silica.

13. A molding composition which is particularly suited for used in the impervious encapsulation of an electronic component via injection molding according to claim 1 wherein said particulate inorganic material is fused silica which bears a surface coating which aids in accomplishing its substantially uniform dispersal in component (a).

14. A molding composition which is particularly suited for use in the impervious encapsulation of an electronic component via injection molding according to claim 1 wherein said particulate inorganic material is fused silica which bears a silane surface coating which aids in accomplishing its substantially uniform dispersal in component (a).

15. A molding composition which is particularly suited for use in the impervious encapsulation of an electronic component via injection molding according to claim 1 wherein said composition is capable of being injection molded at a temperature within the range of approximately 250° to 390° C.

16. A molding composition which is particularly suited for use in the impervious encapsulation of an electronic component via injection molding according to claim 1 wherein said composition is capable of being injection molded at a temperature within the range of approximately 250° to 390° C. at which temperature said composition exhibits a melt viscosity within the range of approximately 300 to 1500 poise at a shear rate of 100 sec.$^{-1}$.

17. A molding composition which is particularly suited for use in the impervious encapsulation of an electronic component via injection molding according to claim 1 wherein said composition includes less than 50 parts per million of water-extractable alkali metal, and less than 100 parts per million of water-extractable halogen.

18. A molding composition which is particularly suited for use in the impervious encapsulation of an electronic component via injection molding according to claim 1 wherein following the molding thereof exhibits a V-0 burning rating when subjected to the UL-94 test.

19. A molding composition which is particularly suited for use in the impervious encapsulation of an electronic component via injection molding according to claim 1 wherein following the molding thereof exhibits a volumetric coefficient of thermal expansion of no more than $150 \times 10^{-6}$ cm.$^3$/cm.$^3$°C. at 60° to 110° C.

20. A molding composition which is particularly suited for use in the impervious encapsulation of an electronic component via injection molding according to claim 1 wherein following the molding thereof exhibits a thermal conductivity of at least $10 \times 10^{-4}$ cal.-cm./sec. cm$^2$°C.

21. A molding composition which is particularly suited for use in the impervious encapsulation of an electronic component via injection molding according to claim 1 wherein following the molding thereof exhibits hydrolytic stability as evidenced by a retention of at least 75 percent of the flexural strength thereof following 200 hours in water at 110° C.

* * * * *